United States Patent
Pal

(10) Patent No.: US 10,405,460 B2
(45) Date of Patent: Sep. 3, 2019

(54) CIRCUIT BREAKER ARRANGEMENTS

(71) Applicant: Hamilton Sundstrand Corporation, Charlotte, NC (US)

(72) Inventor: Debabrata Pal, Hoffman Estates, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 295 days.

(21) Appl. No.: 15/094,351

(22) Filed: Apr. 8, 2016

(65) Prior Publication Data

US 2017/0295672 A1    Oct. 12, 2017

(51) Int. Cl.
*H05K 7/20* (2006.01)
*H01H 83/20* (2006.01)
*B64D 41/00* (2006.01)

(52) U.S. Cl.
CPC ......... *H05K 7/20409* (2013.01); *B64D 41/00* (2013.01); *H01H 83/20* (2013.01); *B64D 2221/00* (2013.01)

(58) Field of Classification Search
CPC ............... H05K 7/20409; B64D 41/00; B64D 2221/00; H02B 1/56; H02B 1/04; H01H 83/20
USPC .......................................... 361/634, 676–678
See application file for complete search history.

(56) References Cited

U.S. PATENT DOCUMENTS

| | | | |
|---|---|---|---|
| 4,024,441 A * | 5/1977 | Coyle | H02B 1/21 174/129 B |
| 5,297,025 A * | 3/1994 | Shoquist | H05K 5/0247 307/150 |
| 6,018,455 A * | 1/2000 | Wilkie, II | H02B 1/21 165/80.3 |
| 6,084,193 A * | 7/2000 | Pellon | H01H 9/32 218/117 |
| 6,104,602 A * | 8/2000 | Morris | H05K 7/20127 165/185 |
| 6,710,695 B1 * | 3/2004 | Pellon | H01H 13/62 200/43.13 |
| 7,336,477 B2 * | 2/2008 | Weister | H01H 9/52 165/104.33 |
| 8,445,800 B2 * | 5/2013 | Mills | H01H 9/52 200/304 |
| 9,245,699 B2 | 1/2016 | Horowy et al. | |
| 2012/0152706 A1 * | 6/2012 | Mills | H01H 9/52 200/296 |
| 2014/0091617 A1 * | 4/2014 | Horowy | H01H 9/52 307/9.1 |
| 2014/0334074 A1 * | 11/2014 | Pal | H05K 7/20154 361/676 |
| 2016/0380412 A1 * | 12/2016 | Pal | H02B 1/56 361/637 |
| 2017/0076877 A1 * | 3/2017 | Pal | H01H 1/62 |

* cited by examiner

*Primary Examiner* — Anthony M Haughton
*Assistant Examiner* — Yahya Ahmad
(74) *Attorney, Agent, or Firm* — Locke Lord LLP; Scott D. Wofsy; Judy R. Naamat

(57) ABSTRACT

A circuit breaker arrangement includes a housing, a contact seated in the housing, and a lead in electrical communication with the at least one contact and disposed outside the housing. The circuit breaker arrangement includes a heat sink in thermal communication with the lead to transfer heat between the contact and the lead.

19 Claims, 5 Drawing Sheets

CIRCUIT BREAKER ARRANGEMENTS

BACKGROUND OF THE INVENTION

1. Field of the Invention

The present disclosure relates electrical systems, and more particularly to circuit breakers for electrical power distribution systems.

2. Description of Related Art

Power distribution systems, such as aircraft electrical systems, commonly employ circuit breakers to provide overcurrent protection for devices connected to the power distribution system. The circuit breakers connect the devices with power sources and are generally responsive to heat from current flowing through the breaker to disconnect the device from the power source when current flow through the breaker approaches a level where the device could be damaged. Such 'trip' events remove power from the electrical device, preventing such current flows from damaging the electrical devices.

Trip events can be influenced by breaker internal temperature. Breaker internal temperature is in turn is influenced by resistive heating of current-carrying elements within the breaker, higher currents driving higher internal temperatures. In some circuit breakers heat from acceptable current flows can build within the breaker due to the heat transfer rate between the breaker and the external environment. Such heat buildup can potentially cause the circuit breaker to trip at current flows that do not exceed the rating of the circuit breaker, resulting in a nuisance trip. Nuisance trips can unnecessarily interrupt the operation of devices connected to the circuit breaker, reducing system reliability.

Such conventional methods and systems have generally been considered satisfactory for their intended purpose. However, there is still a need in the art for improved circuit breaker assemblies. The present disclosure provides a solution for this need.

SUMMARY OF THE INVENTION

A circuit breaker arrangement includes a housing, a contact seated within the housing, and a lead in electrical communication with the one contact and disposed outside the housing. A heat sink is in thermal communication with the lead to transfer heat between the contact and the one lead.

In certain embodiments, the head sink can be attached to the lead. A lug can extend through the housing. The lug can be attached to the contact. The lug can be in electrical communication with the contact. The lug can be in thermal communication with the contact. The lead can be attached to the lug. The lead can be attached to the lug outside of the housing. The lead can be in electrical communication with the lug. The lead can be in thermal communication with the lug. The heat sink can be in thermal communication with the contact through a thermal conduction path extending through the lead and the lug. It is contemplated that the lead can be an 8 American wire gauge size lead, the circuit breaker arrangement can be rated 43 or more amps, and the thermal conduction path can be sized to transfer heat at a rate of 13 watts or more from the contactor to the heat sink.

In accordance with certain embodiments, the contact can be a first contact and a second contact can be seated within the housing. A second lug can be attached to the second contact. The second lug can be in electrical communication with the second contact. The second lug can be in thermal communication with the second contact. A second lead can be attached to the second lug. The second lead can be in thermal communication with the second lug. The heat sink can attached to the second lead. The heat sink can be in thermal communication with the second contact through second thermal conduction path extending through the second lug and the second lead.

It is contemplated that the heat sink can include an electrically conductive material. The heat sink can include an electrically insulative material. The heat sink can include a sink body with fins and a slot. The slot can be disposed on a side of the sink body opposite the fins. The fins can be angled relative to the slot, such as at a 90-degree angle. The lead can be compressively seated in the slot of the heat sink. The lead can include a conductor with insulation disposed about the periphery of the conductor. The lead can be seated with the heat sink such that the electrical insulation of the lead separates the conductor of the lead from the heat sink. It is contemplated that the sink body can be a first sink body, the heat sink can include a second slotted sink body attached (e.g., clamped) to the first sink body with slots of sink bodies aligned to one another along lengths of the first and second slots.

It is also contemplated that, in accordance with certain embodiments, the circuit breaker arrangement can include a breaker element. The breaker element can be disposed within the housing. The breaker element can be movable between an engaged position and a disengaged position. In the disengaged position, the breaker element can be separated from either or both the first and second contacts. In the engaged position the breaker element physically contact the first contact and the second contact. In the engaged position the breaker element can be in electrical communication with the first contact and the second contact. In the engaged position the breaker element can be in thermal can be in thermal communication with the first contact and the second contact. In the engaged position, the breaker element can be in thermal communication with the heat sink in parallel through the first conduction path and the second conduction path.

An aircraft power distribution system includes a power bus electrically connected to a power distribution panel. The power distribution panel has a circuit breaker arrangement as described above. The housing is mounted to the power distribution panel. The first contact is seated within the housing and the first lead is in electrical communication with the first contact. The second contact is seated within the housing and the second lead is in electrical communication with the second contact. The heat sink is in thermal communication with the first lead and the second lead to transfer heat between the first contact and the second contact and the heat sink.

A method of removing heat from a circuit breaker arrangement includes generating heat in a contactor of a circuit breaker arrangement. The heat is transferred from the contactor to a lead in electrical communication with the contactor. The heat is further transferred from the lead to a heat sink in thermal communication with the lead.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
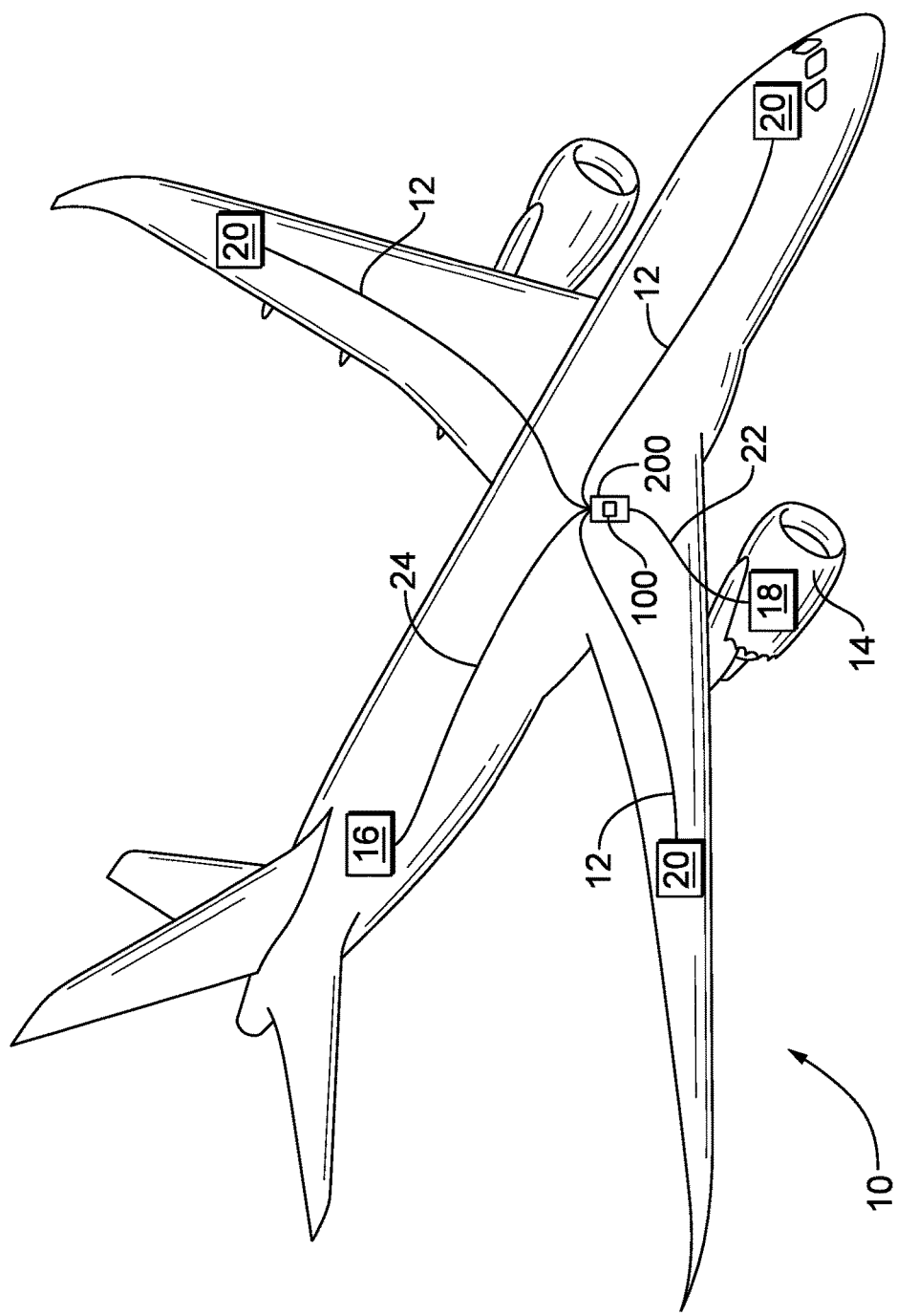
FIG. 1 is a schematic view of an exemplary embodiment of a circuit breaker arrangement constructed in accordance with the present disclosure, showing an aircraft electrical system with a power distribution panel mounting the circuit breaker arrangement.

Reference will now be made to the drawings wherein like reference numerals identify similar structural features or aspects of the subject disclosure. For purposes of explanation and illustration, and not limitation, a partial view of an exemplary embodiment of a circuit breaker arrangement in accordance with the disclosure is shown in FIG. 1 and is designated generally by reference character 100. Other embodiments of power distribution systems and power distribution panels employing such circuit breaker assemblies in accordance with the disclosure, or aspects thereof, are provided in FIGS. 2-5, as will be described. The systems and methods described herein can be used in power distribution systems for aircraft, though the present disclosure is not limited to aircraft or to power distribution systems in general.

With reference to FIG. 1, an aircraft 10 is shown. Aircraft 10 includes a power distribution system 12 with a power distribution panel 200, a main engine 14, an auxiliary power source 16, and one or more power-consuming device 20. Main engine 14 is operably connected to a main generator 18 to provide mechanical rotation to main generator 18. Main generator 18 is electrically connected to power distribution panel 200 by an alternating current (AC) power bus 22, and converts mechanical rotation received from main engine 14 into electrical power, which main generator 18 provides to power distribution panel 200. Auxiliary power source 16, which may include a battery, is electrically connected to power distribution panel 200 by a direct current (DC) power bus 24, and is also configured to provide electrical power to power distribution panel 200.

Power distribution panel 200 includes at least one circuit breaker arrangement 100. Circuit breaker arrangement 100 is connected between AC power bus 22 or DC power bus 24, and one or more power-consuming device 20, and routes electrical power from the power source to power-consuming device 20. Circuit breaker arrangement 100 is configured and adapted to disconnect AC power bus 22 or DC power bus 24 from the power-consuming device when current exceeds a predetermined value, such as when current flowing through the circuit breaker arrangement 100 exceeds a rating of the circuit breaker arrangement 100. In embodiments circuit breaker arrangement 100 may be a thermal circuit breaker configured to detect overcurrent based on the temperature of current-carrying components of circuit breaker arrangement 100.

Figure 2:
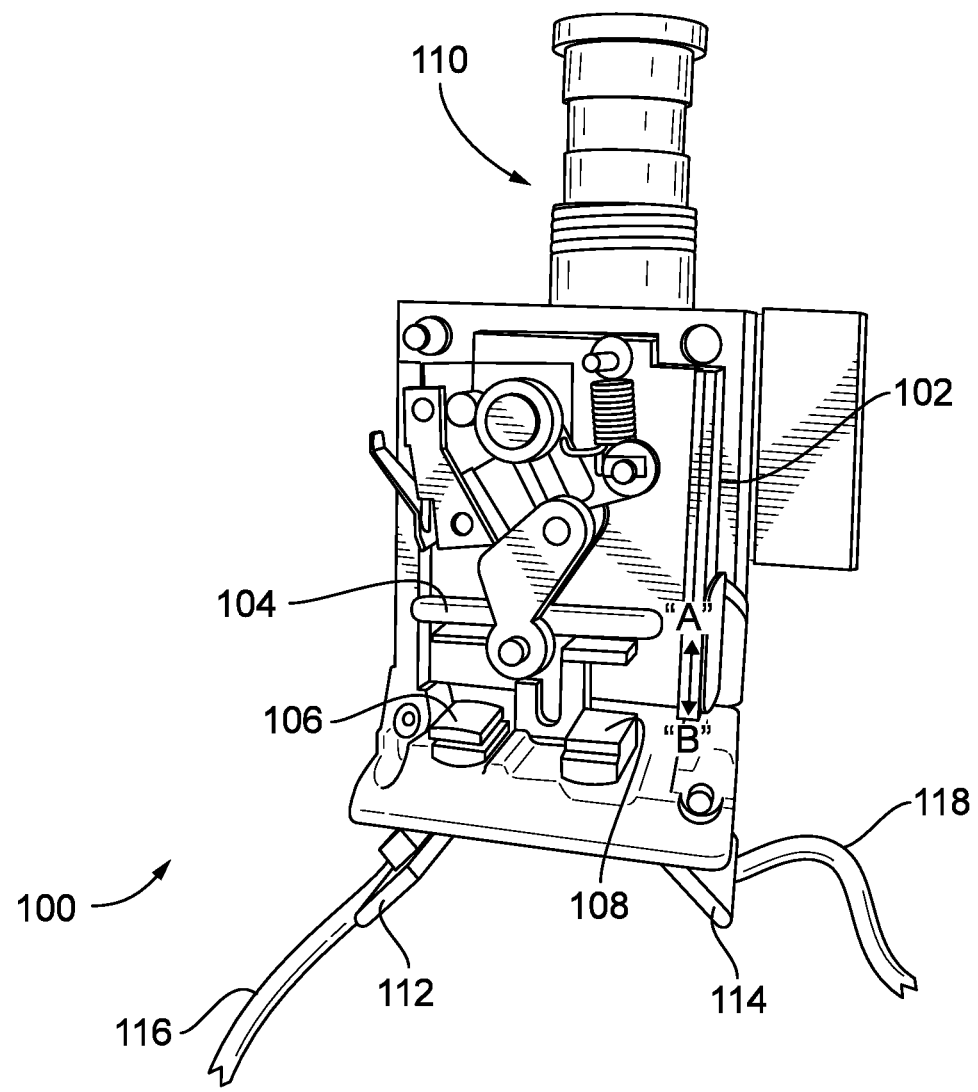
FIG. 2 is a side elevation view of the circuit breaker arrangement of FIG. 1, showing the contact and a breaker element movable between an engaged and disengaged position within an interior of a housing of the circuit breaker arrangement.

With reference to FIG. 2, a circuit breaker arrangement 100 is shown. Circuit breaker arrangement 100 includes a housing 102 (shown with a portion removed for reasons of clarity), a breaker element 104, a first contact 106, a second contact 108, and a mounting feature 110. Circuit breaker arrangement 100 also includes a first lug 112, a second lug 114, a first lead 116 and a second lead 116 118, and a heat sink 124 (shown in FIG. 3).

Mounting feature 110 disposed on an end opposite first contact 106 and second contact 108 such that breaker element 104 is interposed between mounting feature 110 and first contact 106 and second contact 108. Mounting feature 110 is adapted and configured to fix circuit breaker arrangement 100 in power distribution panel 200 (shown in FIG. 1), and in the illustrated exemplary embodiment includes a male threaded body.

Housing 102 is constructed from an electrically insulative material with a thermal conductivity that is lower than that forming first contact 106 and second contact 108. The electrically insulative material may be a polymeric material or any other suitable electrically insulating material, and electrically isolates components within housing 102 from the environment external to housing 102.

First contact 106 and second contact 108 are seated within housing 102 and include an electrically conductive material such as aluminum, copper, or alloys thereof. The electrically conductive material forming first contact 104 and second contact 108 has a thermal conductivity that is greater than the thermal conductivity of the material forming housing 102.

First lug 112 and second lug 114 are formed of an electrically conductive material such as copper, aluminum, or alloys thereof, and may include the same material as that included in first contact 106 and second contact 108. First lug 112 is in electrical communication with first contact 106, is in thermal communication with first contact 106, and extends through housing 102 to connect with first contact 106. Second lug 114 is similar in arrangement with first lug 112 with the difference that second lug 114 is in electrical communication with second contact 108, is in thermal communication with second contact 108, and extends through housing 102 to connect to second contact 108.

First lead 116 is in electrical communication with first lug 112, is in thermal communication with first lug 112, and is connected to first lug 112 outside of housing 102. Second lead 118 is similar to first lead 116 with the difference that second lead 118 is in electrical communication with second lug 114, is in thermal communication with second lug 114, and is connected to second lug 114 outside of housing 102. One of first lead 116 and second lead 118 can connect to a power source, e.g., AC power bus 22 or DC power bus 24 (shown in FIG. 1), and the other of first lead 116 and second lead 118 can connect to power-consuming device 20 (shown in FIG. 1). It an exemplary embodiment either or both of first lead 116 and second lead 118 include an 8 American wire gauge (AWG) conductor.

Breaker element 104 is disposed within housing 102 and has a disengaged position A and an engaged position B. When breaker element 104 is in the disengaged position A, (shown in FIG. 2), first contact 106 is electrically disconnected from second contact 108. When breaker element 104 is in engaged position A (shown in FIG. 3), breaker element 104 is in electrical communication with first contact 106 and second contact 108, is in thermal communication with first contact 106 and second contact 108, and removably contacts first contact 106 and second contact 108. Responsive to temperature increase above a predetermined temperature, breaker element 104 displaces from engaged position B to disengaged position A (e.g., by moving upwards relative to the top of FIG. 2) toward mounting feature 110 and away from first contact 106 and second contact 108, breaking electrical communication of first contact 106 with second contact 108 through breaker element 104.

As will be appreciated by those of skill in the art in view of the present disclosure, the predetermined temperature is selected to correspond with current flow through breaker element 104 that exceeds the current rating of circuit breaker arrangement 100. In certain embodiments, the current rating of circuit breaker arrangement 100 is 43 amps or greater. As will also be appreciated, components of circuit breaker arrangement 100 like housing 102, breaker element 104, first contact 106, and/or second contact 108 can increase in temperature in the event that heat from resistive heating of components is not dissipated at substantially the same rate to the external environment as generated, potentially causing breaker element 104 to move to disengaged position A at current flows below the rating of circuit breaker arrangement 100.

Heat sink 120 (shown in FIG. 3) increases heat transfer between circuit breaker arrangement 100 and the external environment, drawing heat from within housing 102 through first lead 116 and second lead 118. In certain embodiments the heat drawn through first lead 116 and second lead 118 can be 13 watts or greater.

Figure 3:
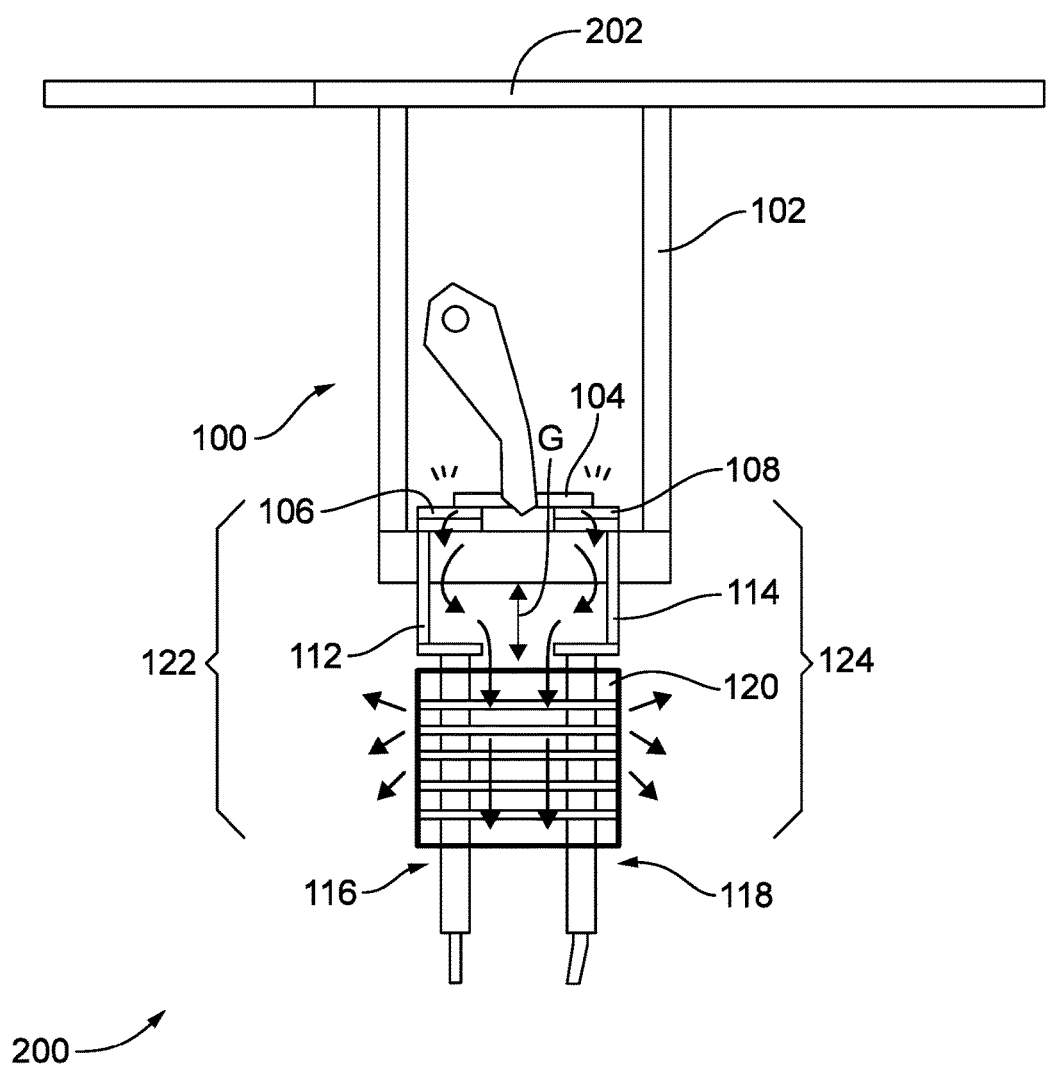
FIG. 3 is a schematic cross-sectional side view of the power distribution panel of FIG. 1, showing contacts of the circuit breaker arrangement connected to a heat exchanger with parallel thermal conduction paths.

With reference to FIG. 3, power distribution panel 200 is shown. Power distribution panel 200 includes a faceplate 202. Circuit breaker arrangement 100 is fixed to faceplate 202, for example by mounting feature 110 (shown in FIG. 2), and is supported by faceplate 202. Heat sink 120 is connected to housing 102 on a side of circuit breaker arrangement 100 opposite faceplate 202 by first lead 116 and second lead 118. A gap G separates heat sink 120 from housing 102, simplifying the construction of heat sink 120.

Heat sink 120 is in thermal communication with first contact 106 and second contact 108 through first lead 116 and second lead 118, and is connected to first lead 116 and second lead 118. In this respect first lead 116 and first lug 112 form a first thermal conduction path 122 that places first contact 106 in thermal communication with heat sink 120. Second lead 118 and second lug 114 form a second conduction path 124 that places heat sink 120 in thermal communication with second contact 108. In certain embodiments, heat sink 120 may include an electrically conductive material, such as aluminum or an alloy thereof. It is also contemplated that heat sink 120 may include an electrically insulative material, such as a polymeric material by way of non-limiting example.

When breaker element 104 is in the engaged position B (shown in FIG. 3), both first contact 106 and second contact 108 are in thermally communicative with heat sink 120 through first conduction path 122 and second conduction path 124 in a parallel arrangement. As a result, heat generated by current-carrying components of circuit breaker arrangement 100, e.g., breaker element 104, first contact 106, and/or second contact 108, is communicated between housing 102 and heat sink 120 through first lug 112 and second lug 114. First lug 112 communicates the heat to first lead 116 and second lug 114 communicates the heat to second lead 118, first lead 116 and second lead 118 communicating the heat to heat exchanger 120 for dissipation to the external environment.

Figure 4:
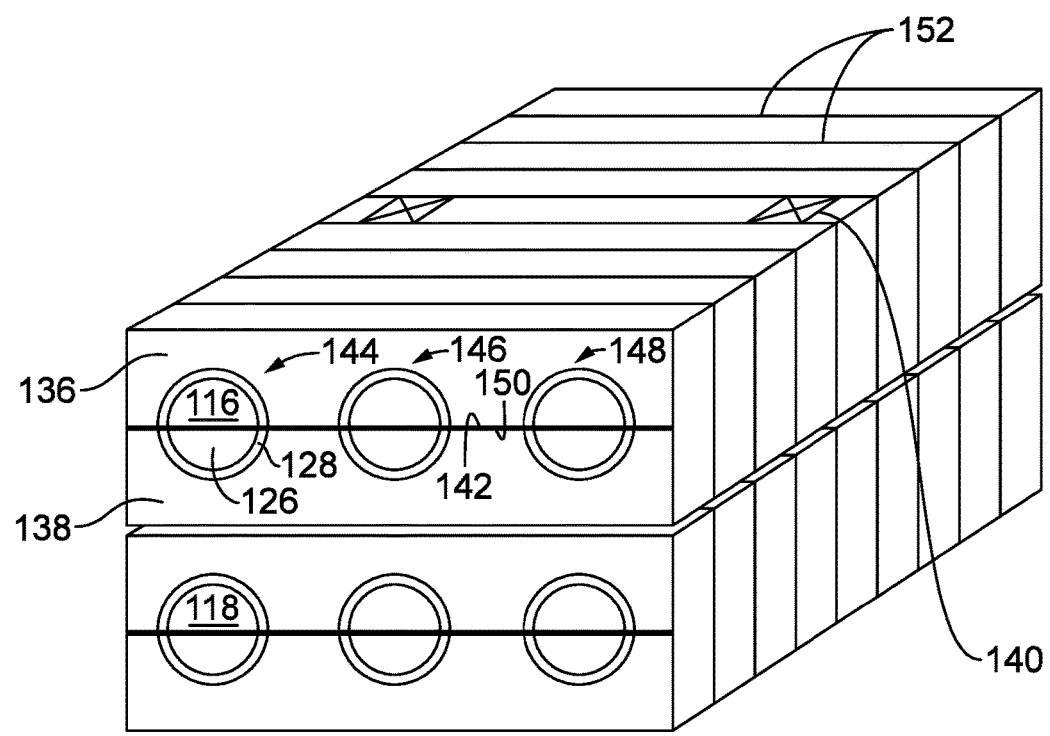
FIG. 4 is a schematic perspective view of the heat sink of FIG. 3, showing first and second sink bodies coupled to one another with leads fixed between the sink bodies, according to an embodiment.

With reference to FIG. 4, heat sink 120 is shown. Heat sink 120 includes a first heat sink body 136, a second heat sink body 138, and a coupler 140. First heat sink body 136 has a mate face 142 with a slot 144 and fins 152. Mate face 142 is substantially planar and defines slot 144 to seat first lead 116, for example portions of first electrical conductor 126 and first electrical insulator 128, therein. In the illustrated exemplary embodiment, slot 144 defines a cross-sectional area with a semicircular shape conforming to the profile of a lead connecting a lug of circuit breaker arrangement 100 and being slight smaller than lead, allowing first heat sink body 136 to compressively fix a lead within slot 144 and facilitating heat transfer from the lead. Compressive force may be provided by coupler 140, which may include a clamp, fasteners, or other suitable compressive fastener.

Fins 152 are disposed on a side of first heat sink body 136 opposite mate face 142. Fins 152 are angled relative slot 144, the angle being about a 90-degree angle in the illustrated exemplary embodiment. Angling fins 152 at a 90-degree angle relative to slot 144 allows for using passive airflow across fins 152 to remove heat from the thermal conduction paths, reducing or eliminating the need to use an active airflow for convection. In the illustrated exemplary embodiment heat sink 120 is a three-phase heat sink, slot 144 being an a A-phase slot and mate face 142 further defining a B-phase slot 146 and a C-phase slot 148 that each extend parallel to and offset from A-phase slot 144.

Second heat sink body 138 is similar in arrangement to first heat sink body 136 and couples to mate face 142 at a mate face 150 defined by second heat sink body 138. Second heat sink body 138 mirrors first heat sink body 136 about an interface formed by mate face 142 of first heat sink body 136 and mate face 150 of second heat sink body 138. Coupler 140 couples second heat sink body 138 to first heat sink body 136 such that slots of second heat sink body 138 align along their lengths with one another, both heat sinks thereby compressively seating the leads within the slots about the entire periphery of the leads along a length of the leads fixed within heat sink 120.

Figure 5:
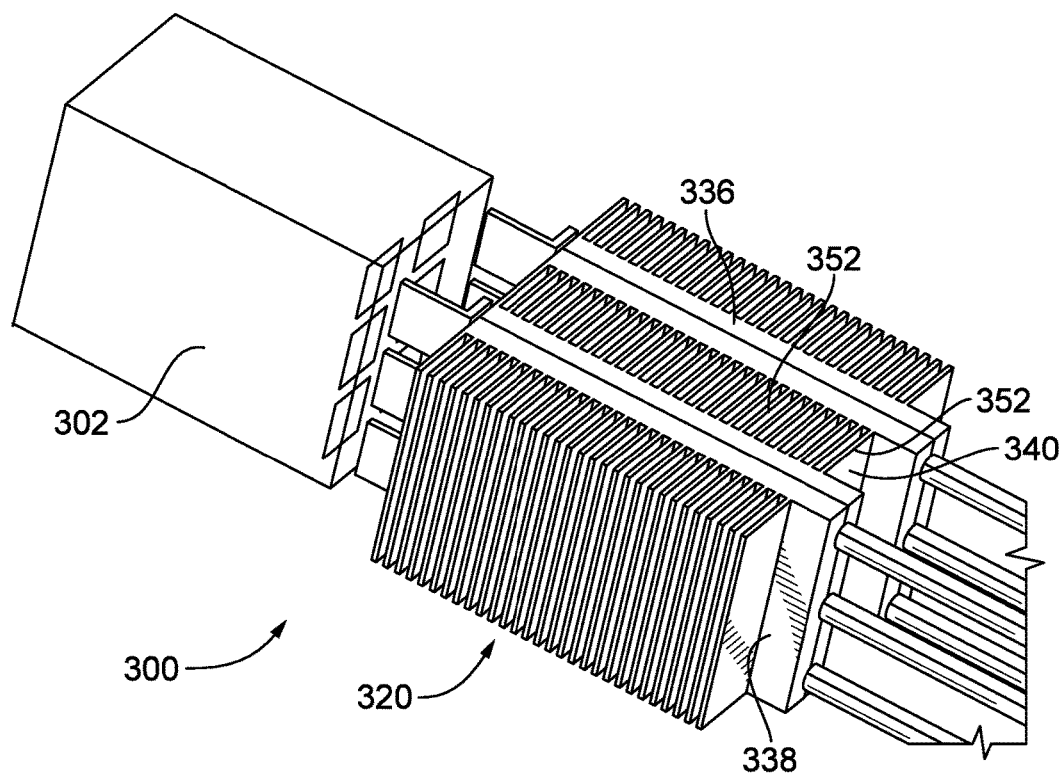
FIG. 5 is a perspective view of the heat sink of FIG. 3, showing first and second sink bodies coupled to an intermediate finned body, according to an embodiment.

With reference to FIG. 5, a circuit breaker arrangement 300 is shown. Circuit breaker arrangement 300 is similar to circuit breaker arrangement 200, and additionally includes a heat sink 320. Heat sink 320 includes a first sink body 336, a second sink body 338, and an intermediate sink body 340. Intermediate sink body 340 is interposed between first sink body 336 and second sink body 338, and additionally includes intermediate fins 352. Intermediate fins 352 extend between first sink body 336 and second sink body 338 and increase the rate of heat removal from leads fixed within heat sink 320.

Thermal circuit breakers can generate heat from resistive heating of contacts disposed within the circuit breaker housing 302 and/or from resistive heating the breaker element spanning the contacts when engaged. In some circuit breaker assemblies, such as high current circuit breakers conveying amperages of 40 or more amps, the contacts can generate heat which is beyond the heat dissipation capability of the circuit breaker housing, thereby increasing temperature of the circuit breaker. For example, some 43 amp breakers connected with 8 AWG size leads can generate upwards of 13 watts of heat beyond that which the leads can dissipate from the housing without resulting in an over-temperature trip. This can thermally soak the circuit breaker, potentially causing the circuit breaker to trip at a lower ambient temperature and/or rated current flow than intended.

In embodiments described herein, a heat sink is connected to the leads. The heat sink has a first and second sink bodies with slots for seating the leads, and may be clamped to compressively fix the leads between the first and second sink bodies to increase heat transfer from the leads to the sink bodies. The sink body may be separated from the housing 302 of the circuit breaker arrangement, simplifying the construction of the sink body while retaining thermal communication with the contacts of the circuit breaker arrangement. It is contemplated that, for a circuit breaker housed in a power panel with a 70 degree Celsius ambient temperature, that the lead temperature can run at about 165 degrees Celsius without a heat sink, and at about 140 degrees Celsius with a heat sink as described herein. Corresponding temperature reduction is experienced by the contactors seated within housing of the circuit breaker arrangement.

The methods and systems of the present disclosure, as described above and shown in the drawings, provide for circuit breaker assemblies with superior properties including reduced contact operating temperature for a given current rating and housing thermal conductivity. While the apparatus and methods of the subject disclosure have been shown and described with reference to preferred embodiments, those skilled in the art will readily appreciate that change and/or modifications may be made thereto without departing from the scope of the subject disclosure.

What is claimed is:

1. A circuit breaker arrangement, comprising:
a housing;
at least one contact seated in the housing;
at least one lead in electrical communication with the at least one contact and disposed outside of the housing; and
a heat sink in thermal communication with the at least one lead,
wherein the heat sink comprises a sink body with fins and a slot, the slot being disposed on a side of the sink body opposite the fins,
wherein the lead is compressively seated within the slot of the sink body, and
wherein the sink body is a first sink body, and further including a second sink body with a slot, the second sink body is attached to the first sink body such that the slot of the second sink body overlays the slot of the first sink body.

2. The circuit breaker arrangement as recited in claim 1, wherein the heat sink is separated from the housing by a gap.

3. The circuit breaker arrangement as recited in claim 1, wherein the heat sink and the contact are in thermally communication through a thermal conduction path including the lead transfer heat between the contactor and the heat sink.

4. The circuit breaker arrangement as recited in claim 1, further including a lug attached to the contact and extending through the housing, the lead being attached to the lug outside the housing.

5. The circuit breaker arrangement as recited in claim 1, wherein the fins are angled at about a 90-degree angle relative to the slot.

6. The circuit breaker arrangement as recited in claim 1, wherein the lead is an 8 AWG lead, wherein the circuit breaker arrangement is rated for at least 43 amps, and wherein a thermal conduction path including the lead and the heat sink draws 13 watts or greater from an interior of the housing.

7. The circuit breaker arrangement as recited in claim 1, wherein the contact is connected to the heat sink through parallel legs of a thermal conduction path including the lead and the heat sink.

8. The circuit breaker arrangement as recited in claim 1, further including a breaker element disposed within the housing and movable between an engaged position and a disengaged position, the breaker element and the contact being electrically connected in the engaged position.

9. The circuit breaker arrangement as recited in claim 1, wherein the heat sink includes an electrically conductive material.

10. The circuit breaker arrangement as recited in claim 1, wherein the heat sink includes an electrically insulative material.

11. The circuit breaker as recited in claim 1, further comprising an electrical insulator separating a conductor of the lead from the heat sink.

12. The circuit breaker arrangement as recited in claim 1, wherein the at least one contact includes a first contact and further including a second contact seated within the housing, the second contact and the heat sink being thermally coupled through a thermal conduction path including the first contact and the second contact.

13. The circuit breaker arrangement as recited in claim 1, further comprising a power bus connected to the contact by the lead, wherein the heat sink arranged between the contact and the power bus.

14. The circuit breaker arrangement as recited in claim 1, wherein the lead is compressively seated in the slot of the second body.

15. The circuit breaker arrangement as recited in claim 1, wherein the heat sink is located between the contact and a power bus supplying the contact, wherein the heat sink is located between the contact and a power-consuming device supplied by the contact.

16. The circuit breaker arrangement as recited in claim 1, wherein the lead is a first lead and further comprising a second lead in electrical communication with the and disposed outside of the housing, wherein the heat sink is in thermal communication with both the first lead and the second lead, the first lead and the second lead each being compressively seated within the heat sink.

17. An aircraft power distribution system, comprising:
a power bus;
a power distribution panel with a circuit breaker arrangement electrically connected to the power bus, the circuit breaker arrangement including:
a housing mounted to the power distribution panel;
a first contact seated within the housing;
a first lead in electrical communication with the first contact;
a second contact seated within the housing;
a second lead in electrical communication with the second contact;
a heat sink in thermal communication with the first lead and the second lead to transfer heat between the first contact and the second contact and the heat sink; and
a breaker element disposed within the housing and movable between an engaged and disengaged positions, the breaker element being in electrical communication with the first contact and the second contact in the engaged position, wherein the first contact is in thermal communication with the heat sink through a first conduction path including the first lead and a second conduction path including the second lead when the breaker element is in the engaged position.

18. The aircraft electrical system as recited in claim 17, wherein the heat sink is disposed on a side of the housing opposite the power distribution panel.

19. A method of removing heat from a circuit breaker arrangement, comprising:
generating heat in at least one contactor of a circuit breaker arrangement;
transferring the heat from the at least one contactor to a first lead and a second lead in electrical communication with the at least one contactor; and
transferring the heat from the first lead and the second lead to a heat sink in thermal communication with the first lead and the second lead.

\* \* \* \* \*